United States Patent [19] Zilkha

[11] 3,797,630
[45] Mar. 19, 1974

[54] KEYBOARD FOR ELECTRONIC CIRCUIT

[75] Inventor: Sammy Zilkha, Esher, England

[73] Assignee: Alphanumeric Holdings Limited, Surrey, England

[22] Filed: July 12, 1971

[21] Appl. No.: 161,611

[52] U.S. Cl. .................. 197/98, 340/365, 179/90 K, 235/145

[51] Int. Cl. .................................................. B41j 5/08

[58] Field of Search ........ 197/17, 98; 340/365, 173; 179/90 K; 235/145, 146; 178/79, 81; 307/88 ET; 200/52, DIG. 1, 159, 166

[56] References Cited

UNITED STATES PATENTS

| | | | |
|---|---|---|---|
| 3,588,875 | 6/1971 | Gabor | 340/347 |
| 3,551,616 | 12/1970 | Juliusburger et al. | 200/46 |
| 3,584,162 | 6/1971 | Krakinowski | 200/5 |
| 3,382,338 | 5/1968 | Arseneault et al. | 197/98 UX |
| 3,308,253 | 3/1967 | Krakinowski | 200/159 B |
| 3,489,082 | 1/1970 | Morris | 101/153 |
| 3,631,472 | 12/1970 | Lincoln | 340/365 C |
| 3,219,776 | 11/1965 | Yerkovich | 200/159 A X |
| 3,653,038 | 3/1972 | Webb et al. | 197/98 X |
| 3,182,158 | 5/1965 | Beardow et al. | 200/159 |

OTHER PUBLICATIONS

Abbatecola et al., "Threshold Capacitive Key" IBM Technical Disclosure Bull. Vol. 13 No. 11 page 3301

*Primary Examiner*—Robert E. Bagwill
*Assistant Examiner*—R. T. Rader
*Attorney, Agent, or Firm*—Cushman, Darby & Cushman

[57] ABSTRACT

An electronic keyboard assembly is formed essentially of three parts, an integrated circuit using high input impedance metal oxide semi-conductors, a printed circuit board electrically connected to the integrated circuit and a number of key assemblies located above the printed circuit board. In a preferred construction, the key assemblies are not electrically connected to the printed circuit board, each key having a conductive element forming, when the key is depressed, a capacitive bridge coupling two conductors on the printed circuit board.

10 Claims, 7 Drawing Figures

KEYBOARD FOR ELECTRONIC CIRCUIT

This invention relates to keyboards for electronic circuits.

Many forms of keyboard are used or have been proposed for providing electrical outputs corresponding to the keys which have been operated. Mechanical contacts in an electrical circuit directly operated by the keys are subjected to wear and reliability problems arise particularly in multi-contact switches such as are used to give a coded output on a plurality of lines. For this reason, contactless keying mechanisms have been developed, for example making use of magnetically operated reed switches or Hall effect devices. Such keyboards however are expensive. In order to try to reduce the cost, proposals have been made to use flexible conductive elements, e.g.; a gold plated plastics film which can be manually depressed to complete a resistive circuit. Such a construction however gives rise to further problems, particularly in the way of "feel" of the keying.

According to this invention, a keyboard comprises a plurality of conductors, and a plurality of keys mounted for movement, against biasing means, towards said conductors, each key having an elastomeric abutment portion engaging at least one conductor when the key is depressed and being arranged for completing a capacitive and/or resistive circuit through at least one of said conductors. The conductors are preferably formed on a printed circuit board. Preferably capacitive coupling is used with the conductor on the key forming a capacitor bridge between two conductors of the printed circuit board. With this construction the key assembly has no physical or electrical connections to the printed circuit board and there can thus be a complete split or division in the assembly between the keys and the printed circuit board.

The invention furthermore includes within its scope a keyboard comprising a printed circuit board having a plurality of conductors; a plurality of keys mounted for movement, against biasing means, towards said printed circuit board, each key having an elastomeric contact portion and a conductive element (conveniently a single element formed of a conductive elastomer) for completing a capacitive circuit, including at least one of said conductors, through said printed circuit board, and thin insulating material between each conductive element and the printed circuit board.

In the last mentioned construction, the aforesaid elastomeric means may comprise a sheet of elastomeric material mounted on a fixed support to be resiliently deflected by the keys so as to constitute said biasing means. Preferably however the biasing means comprises spring means operative to provide a bias against key movement and a separate elastomeric block is mounted in each key. The elastomeric material limits the shock effects of the key hitting the printed circuit board. The biasing means and/or further resilient means can be arranged to permit of over travel of the key after contact is made.

The keyboard may further include means for applying a time-varying electrical signal to said electrical circuit and a threshold-operated receiving device (preferably of high input impedance, e.g., a metal-oxide semi conductive element) responsive to the signal passing through the circuit. The means for applying a time-varying signal and the receiving device may be constituted by an integrated circuit mounted on the printed circuit board. This integrated circuit may include encoding means to provide coded digital output for each key. Such a circuit arrangement, in conjunction with a shift key, may be arranged to provide two alternative outputs from each character key, e.g., corresponding to upper and lower case alphabetical characters. By providing a further control key or keys, the circuit may be arranged for tri-mode or for more than three modes of output from each key.

In a preferred embodiment of the invention, a keyboard comprises a base plate, and, for each key, a cylindrical key support on the base plate, a key carrier formed by a sleeve slidable on the outer surface of the key support, a key member mounted on the key carrier, a plunger within said key support and slidably extending through said base plate, a resilient conductive element on said plunger, a resilient pad within said key member and engaging between said key member and said plunger to permit (for over travel) relative axial movement therebetween, and a helical bias spring within the key support biasing the key carrier away from the base plate, said keyboard further comprising a printed circuit board below said base plate but supported thereby, said printed circuit board having at least two conductors below each key with an insulating layer over the conductors, said conductive element on each key being arranged to provide capacitive coupling between the two conductors below that key when the key is depressed.

In the following description, reference will be made to the accompanying drawings in which.

Figure 1:
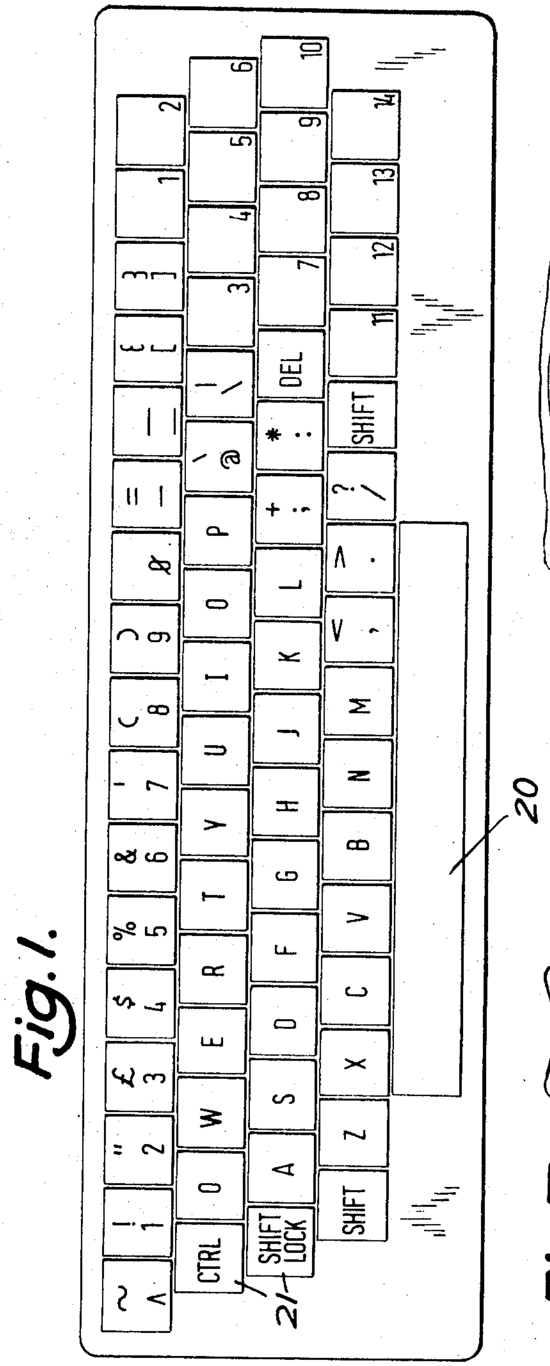
FIG. 1 illustrates the layout of the keys of a keyboard.
Figure 2:
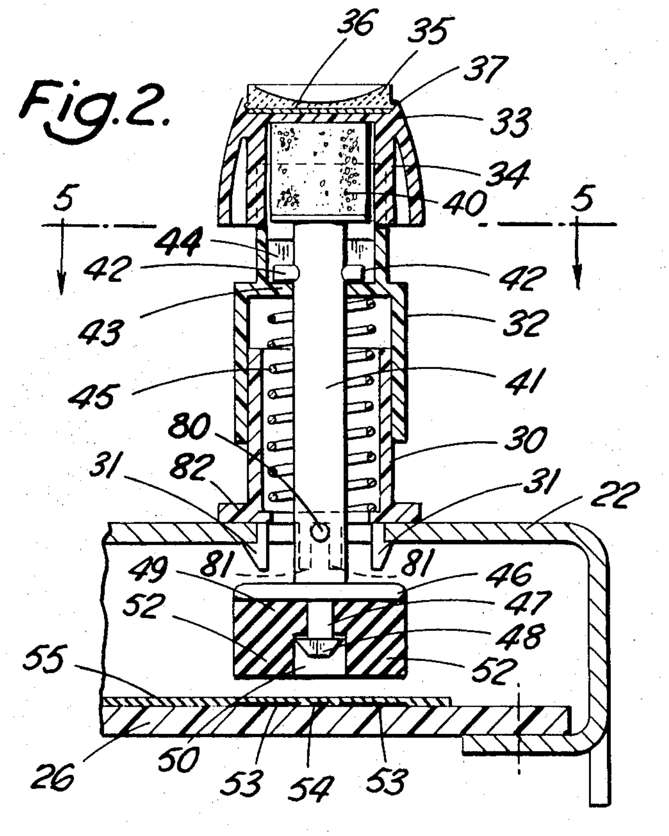
FIG. 2 is a vertical section through a single key, including part of a base plate and a printed circuit board.
Figures 3, 4:
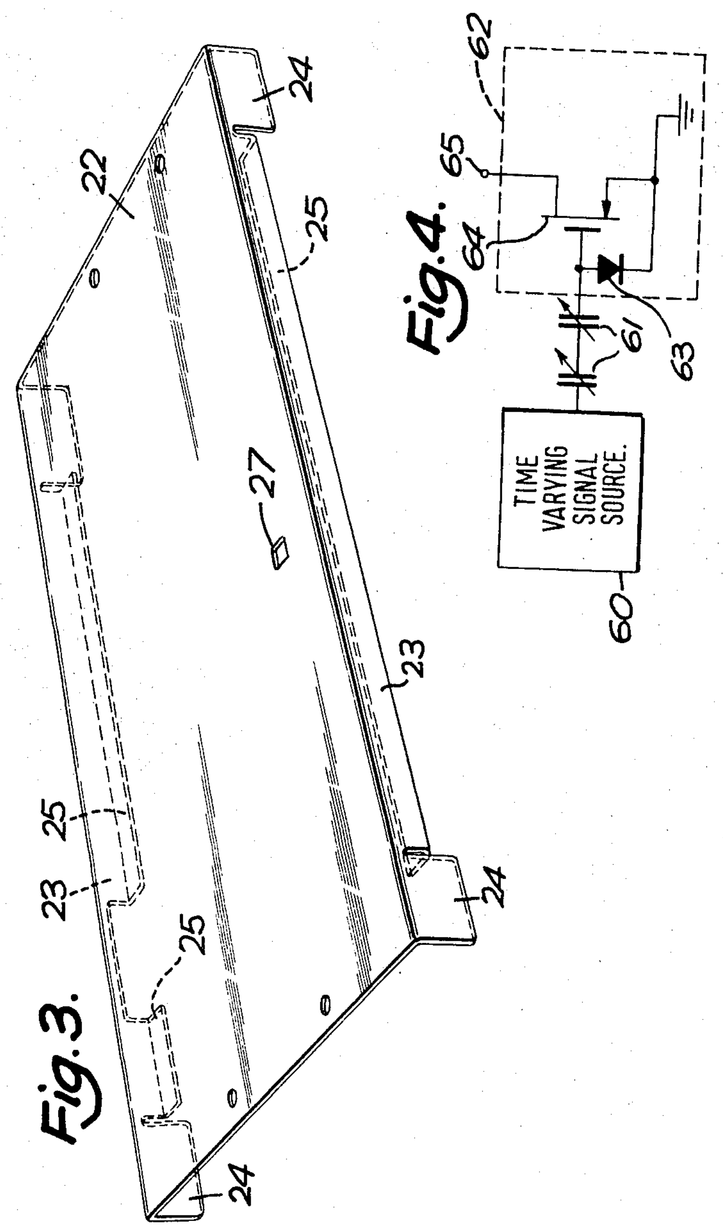
FIG. 3 is a perspective view of a base plate.
FIG. 4 is a diagram showing an electronic circuit associated with a key.

Referring to FIGS. 1 to 3, there is illustrated a keyboard having 68 keys. It will be readily apparent however from the following description that the number and disposition of the keys may readily be chosen to suit the user's requirement. The particular keyboard illustrated in FIG. 1 has 49 character keys each identified with an appropriate legend or legends, and 14 function keys at the right hand end of the keyboard indicated by numerical figures in their bottom right hand corners, which function keys might typically give outputs on a single line. In accordance with conventional practice there are two shift keys and one shift lock key. There is also a space bar 20 at the bottom of the keyboard and a control key 21 at the left hand side which, when depressed, gives "tri-mode" operation in which the character keys give tri-mode code outputs.

The present invention is concerned more particularly with the construction of the keyboard. In the embodiment illustrated a metal base plate 22 (FIG. 3) on two opposite sides has a downwardly extending flange 23. The end portions 23 of the flanges form feet for the base plate and the control portions of the flanges are partially turned inwardly as shown at 25 to form a support for a printed circuit board 26 (FIG. 2). The base plate is punched with square holes, such as hole 27, one for each key in the positions where keys are required. Thus for the keyboard layout shown in FIG. 1, there would be 68 such holes for the keys together with further holes for the space bar etc.

Referring to FIG. 2, for each key, there is a cylindrical key support 30 of moulded plastics material forming a bearing, the key support having four downwardly extending snap portions 31 which can be resiliently forced through the hole 27 in the base plate and engage underneath the underside of the base plate on two opposite sides of the square hole to hold the key support 30 in position and preventing rotation thereof. Slidable axially on the outer cylindrical surface of the key support 30 is a moulded plastics key carrier in the form of a sleeve 32 on the top end of which is secured, with a press fit, a square key top 33 constituting a cap shaped top with portions 34 engaging recesses in four upwardly extending portions of the sleeve 32, the resilience of which holds the key top in position. In the centre of the key top, a clear acrylic plastics window 35 of square shape is snapped into a square recess 36 having an undercut 37 on its four edges for engaging a projection on the four sides of the window 35. This window either covers a legend plate in the recess 36, or, preferably, has the legend in reverse printing on its under surface.

Within the cap formed by the key 33 is an elastomeric foam element 40 of square section in plan lying between the underside of the cap and the top of a plunger of rigid moulded plastics material having a cylindrical stem 41 slidable within the carrier 32. The stem 41 has two bayonet projections 42 to form a bayonet connection to the sleeve 32.

Figure 5:
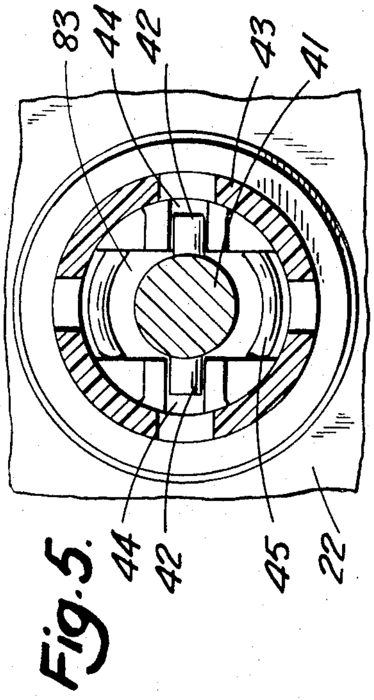
FIG. 5 is a cross-section through a sleeve and plunger of the key assembly of FIG. 2.

The stem 41 of the plunger has two similar bayonet projections 80 near its lower end to form a bayonet connection to the key support 30, the projections 80 being in a plane at right angles to that of projections 42. The two bayonet connections are similar in construction and both permit of limited sliding movement. Considering firstly the lower connection, the projections 80 each lie between a pair of downwardly extending portions 81 formed on a base 82 of the support 30, which base limits upward movement of the projections 80 on the plunger. This base 82 is slotted to permit passage of projections 42 when putting together the key assembly. The upper bayonet connection is shown in plan in FIG. 5; the sleeve 32 has an inwardly extending web 43 with a central aperture through which the stem 41 passes, this web being slotted at 83 so that, on assembly the projections 42 can pass through the slot in the web, the sleeve 32 then being rotated through 90° to align the projections 42 with the gaps between portions 44 which extend upwardly from the web 43. It will be seen that portions 81 prevent rotation of the plunger with respect to the key support 30 and portions 44 prevent rotation of the sleeve with respect to the plunger.

The construction permits of limited axial relative movement between the stem 41 and the carrier 32 with compression of the foam element 40.

A helical spring 45 around the stem 41 within the support 30 forms biasing means urging the carrier upwardly by bearing against the web 43 and thereby urging the projections 42 and thus the stem 41 upwardly.

The stem extends through the hole 27 in the base plate 22 and, formed integrally on the lower end of the stem below the base plate, is a square support portion 46 and, below this, a short square section portion 47 with a head 48 shaped as a truncated four-sided pyramid. A square section block 49 of conductive elastomeric material has a central square section recess 50 on its lower face and, extending into this recess, a bore permitting the block to be forced over the head 48 onto the portion 47 to be retained thereon in contact with the support portion 46 which provides backing to give rigidity to the block 49. the portions 52 of the block lie respectively over two conductors 53 on the printed circuit board 26. Between the conductors 53 is a grounded screen conductor 54. A thin sheet 55 of insulating material covers the printed circuit board forming a coverlay to prevent conductive contact with the conductors so that when the key is pressed down, the conductive elastomeric material provides a capacitive coupling to each of the conductors 53 thereby forming a bridge capacitively coupling these conductors.

Pressure on the key top 33 forces down the sleeve 32 so compressing spring 45 which provides the desired bias against the key movement. The foam element 40 bearing on the top of the stem 41 is not compressed during initial movement of the key as there is no restraint to the plunger. The element 40 thus pushes down the stem so that the block 49 is brought down towards the conductors 53. The elastomeric nature of the block absorbs part of the shock when contact is made. Overtravel of the key, which is ergonomically desirable, can then occur with further compression of the spring 45 and compression also of the foam element 40, this overtravel being within the limits permitted by the top of the key support 30 engaging the web 43 of the sleeve 32. The foam element 40 therefore absorbs the major part of the impact shock.

The above described construction gives a very high degree of protection to the electronic circuits against spillage of liquids or the dropping of solids on the keyboard. Individual keys, key carriers and helical springs can be readily removed for cleaning if necessary and for spring replacement without dismantling the whole assembly, it merely being necessary to take off the key top and then the sleeve 32. Although a construction with a metal base plate 22 and plastics key supports 30 has been described, the base plate and key supports could be moulded integrally of plastics material. This further enhances the protection against spillage of liquids but the use of a metal base plate provides screening. If an integral moulded plastics base plate is used, it may be metal coated for screening.

It will also be noted that there are no electrical connections between each individual key position and the printed circuit board. The conductive elastomer is used as a plate for a dual parallel plate capacitor.

FIG. 4 illustrates diagrammatically part of the electronic circuit associated with a key. A source 60, a time varying signal is applied to one of the conductors 53, the bridged variable capacity between which is indicated by the capacitors 61 in FIG. 4. When the switch is depressed, the capacitive coupling is increased and so applies this signal to a threshold responsive device 62 illustrated as comprising a gate input protection diode 63 and a metal oxide semi-conductor receiving device 64. The output from device 64 at terminal 65 may be further processed in the known way, e.g., to provide a coded parallel or serial digital output.

The responsive device 62 would normally be one of a number of such devices formed as an integrated circuit mounted on the printed circuit board 26. In a small keyboard with only a few keys, e.g., a simple calculator, each key may have its own electronic circuit, in which case, resistive coupling between the conductors can, if desired be employed by omitting coverlay 55. In more complex keyboards, some or all of the keys may cooperate with conductors arranged to form a matrix to give coded outputs representative of the individual keys so reducing the number of electrical connections required between the conductors associated with the keys and the electronic circuits. The integrated circuit is conveniently on the underside of or underneath the printed circuit board. In a matrix system with row or column conductors energised in sequence, sneak path problems do not even occur even if several keys are depressed together and it is thus possible to provide for two key rollover (or for more than two key rollover). Other keyboard facilities such as interlock can also be provided by the electronic circuits. The conductors at each key position may be arranged to give a partial coding e.g. by providing 2 or more outputs when a single key is depressed.

Figure 6:
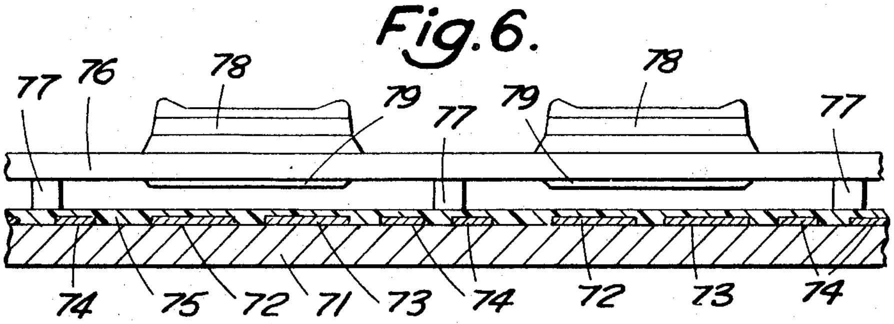
FIG. 6 illustrates an alternative construction of keyboard.

FIG. 6 illustrates another form of construction in which the construction is considerably simplified but in which overtravel of the keys is no longer possible. A printed circuit board 71 has, for each key, a pair of conductors 72, 73 which are to be capacitively coupled be depression of the key. The board 71 may also have further conductors, such as conductors 74, and may also have earth screening conductors, e.g., between the two conductors 72, 73 of each pair. These conductors are all covered by a thin insulating layer 75. Mounted above the printed circuit board is a flexible sheet 76 having ribs 77 (which may be integral with the sheet or attached thereto) as supports between key locations holding the sheet 76 above the board 71. The sheet 76 carries or is formed integrally with raised portions 78 constituting the keys. The sheet 76 may be formed of conducting material but, in the embodiment illustrated, has conductive portions 79, e.g., metallised portions, on the underside of the sheet 76 in each key position. The keyboard of FIG. 6 may be used with, for example, an integrated metal oxide semiconductor circuit as has been described with reference to FIG. 4.

Although it is preferred to employ capacitive coupling, by omitting the sheet 55 of FIG. 2 or the layer 75 of FIG. 6, the keyboards can be made to operate with resistive coupling. Using capacitive coupling, the capacitances can be defined more accurately by providing a grounded screen on the underside of the printed circuit board and by electrically screening the assembly.

It will be noted that the construction of FIG. 6 makes possible the fabrication of a fully encoded keyboard with virtually any desired facilities with a minimum of three separate components, a printed circuit board, a keyborad flexible moulding and an integrated circuit.

The construction of FIG. 6 may be modified by applying the electrical input signals, e.g., pulse signals to sheet 76, which is formed of conducting material. The capacitance, for a given layer of insulation 75 is increased four fold. If resistive contact is employed, there is no danger of increasing leaking currents in the gap between the drive and receiver conductors due to material from the bridge conductor being deposited.

Figure 7:
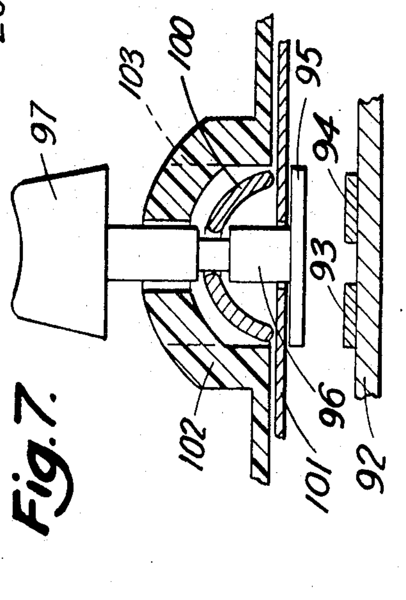
FIG. 7 illustrates yet another key construction.

In some cases, it is preferred to have a key "feel" in which depression of a key initially requires a threshold force which decreases with movement and thus provides a return snap or bias action. This may be achieved by using magnetic attraction to return the key. Another way of achieving this is illustrated in FIG. 7. In that Figure a key has a bottom metal or metallised plate 95 attached to a piston 96 and a key top 97. The piston 96 is of square section to prevent rotation in a guide plate 101. A compressible shaped washer or ring 100 is received in a recess in the piston. This washer is constrained by plate 101, which guides piston 96 for vertical movement, and also by a shaped moulding 102. As the piston is depressed and the washer approaches the horizontal in deforming, the force required to hold it down will decrease. The plate 101 and moulding 102 may be combined in a common moulding having a central aperture indicated by dotted lines 103, thus simplifying key assembly. I claim:

1. A keyboard comprising a base plate, a plurality of keys and, for each key, an associated cylindrical key support on the base plate, and, each of said keys comprising a key carrier formed by a sleeve around and slidable on the key support, a key member mounted on the key carrier, a plunger within said key support and having a stem extending through said base plate, a resilient conductive element on said plunger, a resilient pad within said key member and engaging said key member and said stem to permit relative axial movement therebetween, and a helical bias spring within the key support biasing the key carrier away from the base plate, said keyboard further comprising a printed circuit board below said base plate but supported thereby, said printed circuit board having at least two conductors below each key, said conductive element on each key being arranged to provide capacitive coupling between the two conductors below that key when the key is depressed.

2. A keyboard as claimed in claim 1 wherein said base plate comprises a metal plate with downwardly extending flanges, the flanges on two opposite sides being partially inturned to form a support for said printed circuit board.

3. A keyboard as claimed in claim 1 and having, on said printed circuit board, a grounded conductor between each pair of conductors to be capacitively coupled by depression of a key.

4. A keyboard as claimed in claim 1 wherein said stem has a pair of projections extending radially outwardly, one on each side of the stem and wherein said key carrier has inwardly extending portions engaging said projections to form a bayonet joint.

5. A keyboard as claimed in claim 1 wherein said conductive element on said stem comprises a block of conductive elastomeric material.

6. A keyboard as claimed in claim 5 wherein said block of elastomeric material is shaped to have portions overlying said two conductors with a channel on the underside of the block between said portions.

7. A keyboard as claimed in claim 6 wherein said block of elastomeric material has an aperture and said stem has a downwardly extending portion with a head so that the block can be snapped onto the downwardly extending portion to be secured by said head.

8. A keyboard as claimed in claim 1 wherein said base plate is metal and wherein each of said key carriers is formed of plastics material and is shaped to be held in an aperture in the base plate.

9. A keyborad as claimed in claim 1 wherein said base plate is of plastics material and is moulded integrally with said key carriers.

10. A keyboard as claimed in claim 1 and having an insulating layer over the conductors on the printed circuit board.

* * * * *